United States Patent
Tomomatsu et al.

[11] Patent Number: 5,996,487
[45] Date of Patent: Dec. 7, 1999

[54] SOLDER PASTE SCREEN PRINTING APPARATUS AND SOLDER PASTE SCREEN PRINTING METHOD

[75] Inventors: Michinori Tomomatsu, Koga; Takaaki Sakaue; Minoru Murakami, both of Chikushino, all of Japan

[73] Assignee: Matsushita Electric Industrial Co., Ltd., Osaka, Japan

[21] Appl. No.: 09/052,141

[22] Filed: Mar. 31, 1998

[30] Foreign Application Priority Data

Apr. 11, 1997 [JP] Japan ................................ 9-093501

[51] Int. Cl.⁶ ...................................... B41F 15/44
[52] U.S. Cl. ............................. 101/123; 101/124
[58] Field of Search .................... 101/114, 120, 101/123, 124, 169

[56] References Cited

U.S. PATENT DOCUMENTS

| | | | |
|---|---|---|---|
| 4,372,203 | 2/1983 | Brasa | 101/124 |
| 4,893,556 | 1/1990 | Takahashi et al. | 101/123 |
| 5,479,854 | 1/1996 | Chikahisa et al. | 101/123 |
| 5,483,884 | 1/1996 | Vellanki | 101/123 |

FOREIGN PATENT DOCUMENTS

| | | | |
|---|---|---|---|
| 423428 | 4/1991 | European Pat. Off. | 101/123 |
| 3842419 | 6/1990 | Germany | 101/123 |
| 114649 | 5/1988 | Japan | 101/123 |
| 07164615 | 6/1995 | Japan. | |

*Primary Examiner*—Stephen R. Funk
*Attorney, Agent, or Firm*—Stevens, Davis, Miller & Mosher, L.L.P.

[57] ABSTRACT

There is disclosed a solder paste screen printing apparatus and a solder paste screen printing method, in which a force of pressing of a squeegee can be adjusted delicately and accurately so as to effect the printing of solder paste with the optimum pressing force. A squeegee is connected to a lower end of a rod of a cylinder, and a load cell is provided above the rod. A first pressure and a second pressure are applied respectively to an upper chamber and a lower chamber of the cylinder. A load, applied to the load cell, is measured while varying the level of the first pressure, and the pressure measurement for the pressing force is effected in accordance with the measured load. In accordance with this result, the instruction pressure for the cylinder, which is necessary for obtaining the optimum pressing force, is determined, and then the printing of solder paste onto a substrate is started with this instruction pressure.

6 Claims, 8 Drawing Sheets

SOLDER PASTE SCREEN PRINTING APPARATUS AND SOLDER PASTE SCREEN PRINTING METHOD

BACKGROUND OF THE INVENTION

1. Field of the Invention

This invention relates to a solder paste screen printing apparatus and a solder paste screen printing method for coating solder paste, used to solder electronic parts, onto a workpiece such as a substrate, a chip and a wafer.

2. Description of the Related Art

In a screen printing apparatus for coating solder paste, used to solder electronic parts, on a workpiece such as a substrate, a screen mask is superposed on the substrate, and in this condition a squeegee is slid over the screen mask, so that the solder paste is coated onto electrodes on the substrate through pattern holes formed through the screen mask.

If the force of pressing of a lower end of the squeegee against the upper surface of the substrate is small, the solder paste is not completely filled in the pattern holes, so that the printing becomes defective. In contrast, if the pressing force is too large, the solder paste flows to the lower surface of the screen mask, thereby causing the bleeding, so that the defective printing is encountered. The finer the pitch of the electrodes becomes, the more serious this bleeding problem becomes. In view of these, the squeegee-pressing force must be adjusted to the optimum value.

Under the circumstances, there has been proposed a method of enabling the delicate adjustment of the pressing force (Japanese Patent Unexamined Publication No. 7-164615). In this method, a compression torsion coil spring imparts a spring force acting in a direction to float a squeegee, thereby reducing the force of pressing of the squeegee against a screen mask, so that the required pressing force can be imparted by a cylinder. Therefore, in this method, particularly with respect to electrodes of a fine pitch on the substrate, the pressing force is reduced to a level less than the weight of the squeegee, so that solder paste can advantageously be printed onto the electrodes with a very small pressing force without bleeding.

In the above conventional method, however, the solder paste must be repeatedly coated for trial purposes in order to adjust the spring force of the compression torsion coil spring, and therefore there has been encountered problems that much time and labor are required for the preparations, and that the differences (or variations) between the individual operators are liable to occur.

And besides, the substrate has a warp and undulations, and therefore the squeegee, when slid, moves up and down in accordance with these warp and undulations, and as a result the spring force or the spring constant of the compression torsion coil spring varies in accordance with this upward and downward movement, and the pressing force also varies, so that the printing is liable to become defective.

Furthermore, since it is difficult to measure the pressing force during the time when the squeegee is slid over the screen to effect the printing operation, it is not possible to know the degree of the pressing force with which the printing is actually effected, and therefore there has been encountered a problem that the delicate adjustment of the pressing force is difficult.

SUMMARY OF THE INVENTION

It is therefore an object of this invention to provide a solder paste screen printing apparatus and a solder paste screen printing method, in which a force of pressing of a squeegee can be adjusted delicately and accurately so as to effect the printing of solder paste with the optimum pressing force.

According to one aspect of the invention, there is provided a solder paste screen printing apparatus comprising:
- a positioning table for positioning a workpiece;
- a screen mask located above the workpiece positioned on the positioning table;
- a squeegee for sliding over the screen mask to coat solder paste onto the workpiece through pattern holes formed through the screen mask; and
- a pressing force control mechanism for controlling a force of pressing of the squeegee against the screen mask;
- the pressing force control mechanism comprising:
  - a cylinder including a vertical rod having a lower end to which the squeegee is connected;
  - a first pressure control portion for feeding a fluid to an upper chamber of the cylinder so as to impart a downward force to the rod of the cylinder;
  - a second pressure control portion for feeding the fluid to a Lower chamber of the cylinder so as to impart an upward force to the rod of the cylinder; and
  - a controller for feeding pressure instructions respectively to the first and/or second pressure control portions so as to control the force of pressing of the squeegee against the screen mask by the pressure difference between the fluid in the upper chamber and the fluid in the lower chamber.

Preferably, a load sensor for detecting the squeegee-pressing force, controlled by the pressing force control mechanism, is provided above the squeegee.

According to another aspect of the invention, there is provided a solder paste screen printing method wherein a rod of a cylinder is vertically moved by a pressure difference between a fluid in an upper chamber of the cylinder and the fluid in a lower chamber of the cylinder so as to bring a squeegee, connected to a lower end of the rod, into contact with a screen mask, and in this condition the squeegee is slid over the screen mask to coat solder paste onto a workpiece through pattern holes formed through the screen mask, the method comprising the steps of:
- applying an instruction pressure to the cylinder a plurality of times in accordance with a pressure instruction from a controller, and detecting a squeegee-pressing force by a load sensor each time the instruction pressure is applied to the cylinder;
- finding the correlation between the instruction pressure and the pressing force from the instruction pressure and the pressing force detected by the load sensor;
- finding the instruction pressure, necessary for obtaining an optimum squeegee-pressing force, from the correlation; and
- applying the fluid pressure, determined by the instruction pressure, to the cylinder, thereby effecting printing of the solder paste onto the workpiece.

In the above-described screen printing method, the correlation may be detected by each of a plurality of the load sensors corresponding respectively to a plurality of the cylinders, and be found for each of the cylinders.

According to a further aspect of the invention, there is provided a solder paste screen printing apparatus comprising:
- a positioning table for positioning a workpiece;
- a screen mask located above the workpiece positioned on the positioning table;

a squeegee for sliding over the screen mask to coat solder paste onto the workpiece through pattern holes formed through the screen mask; and a pressing force control mechanism for controlling a force of pressing of the squeegee against the screen mask;

the pressing force control mechanism comprising:

a cylinder including a vertical rod having a lower end to which the squeegee is connected;

a first pressure control portion for applying a fluid pressure to an upper chamber of the cylinder;

a second pressure control portion for applying to a lower chamber of the cylinder a pressure sufficiently large to force a vertically-moving portion, movable with the squeegee, upward; and a controller for controlling the fluid pressure to be applied from the first pressure control portion so as to control the force of pressing of the squeegee against the screen mask.

The screen printing apparatus may further comprise;

a load sensor for detecting an upward pressing force of the squeegee when the fluid pressure, applied from the first pressure control portion, is reduced to move the squeegee upward; and calculation means for calculating the pressure from the first pressure control portion, which pressure is necessary for pressing the squeegee against the screen mask with the target pressing force, in accordance with results of the detection by the load sensor.

According to a still-further aspect of the invention, there is provided a solder paste screen printing method comprising the steps of:

detecting an upward pressing force of the squeegee when the fluid pressure, applied from the first pressure control portion, is reduced to move the squeegee upward;

finding the correlation between the fluid pressure, applied from the first pressure control portion, and the squeegee-pressing force by the detected pressing force;

calculating the fluid pressure, necessary for pressing the squeegee against the screen mask with a target pressing force, from the correlation; and applying the pressure, calculated by the first pressure control portion, to the upper chamber to move the squeegee downward into contact with the screen mask, and moving the squeegee so as to effect the printing of the solder paste.

DESCRIPTION OF THE PREFERRED EMBODIMENTS

In the above constructions of the invention, the correlation between the instruction pressure from the controller and the pressing force is beforehand found, and by doing so, the instruction pressure necessary for obtaining the optimum pressing force is determined, and in accordance with this instruction pressure, solder paste can be printed onto a workpiece such as a substrate.

Figure 1:
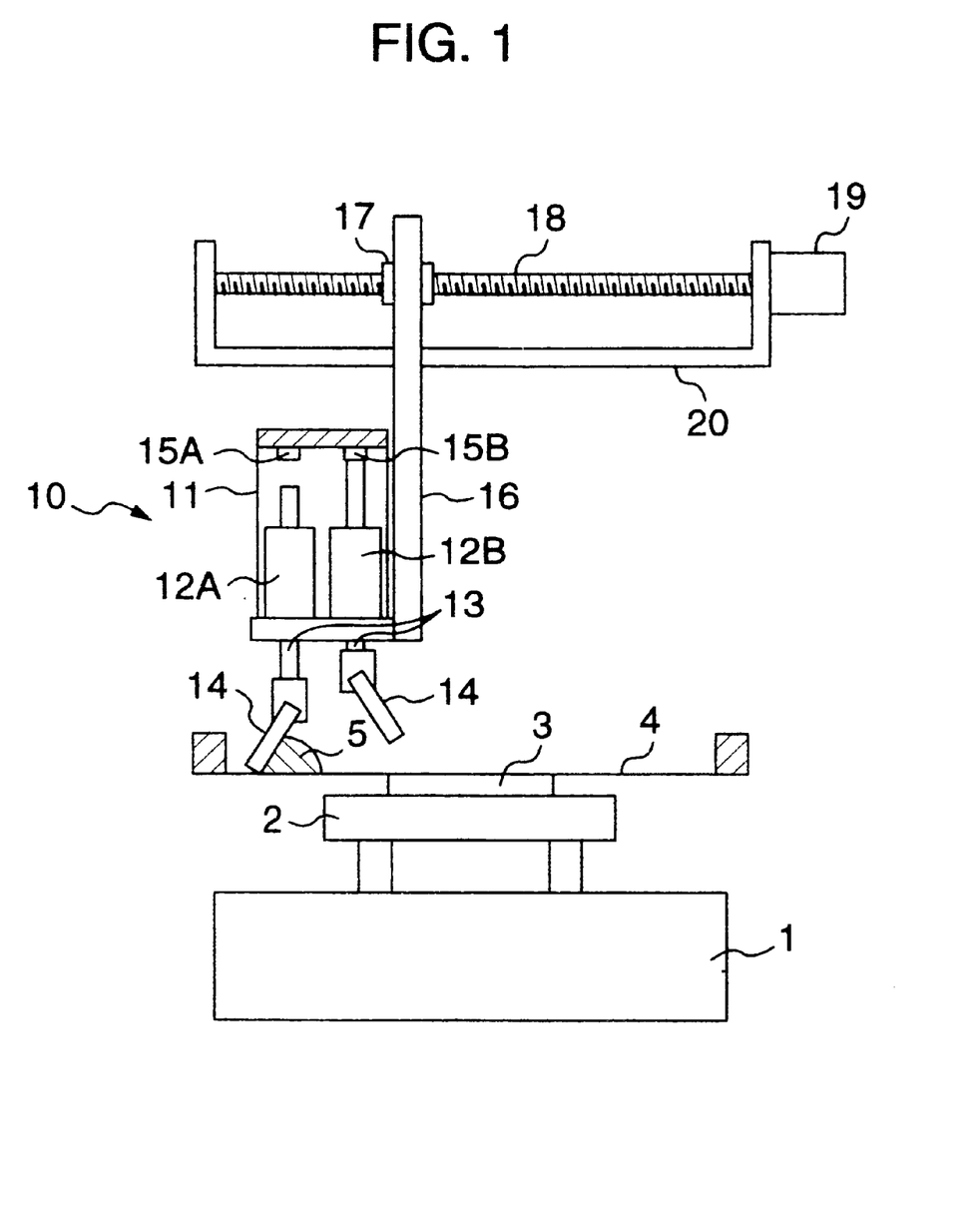
FIG. 1 is a side-elevational view of one preferred embodiment of a solder paste screen printing apparatus of the present invention.
Figure 2:
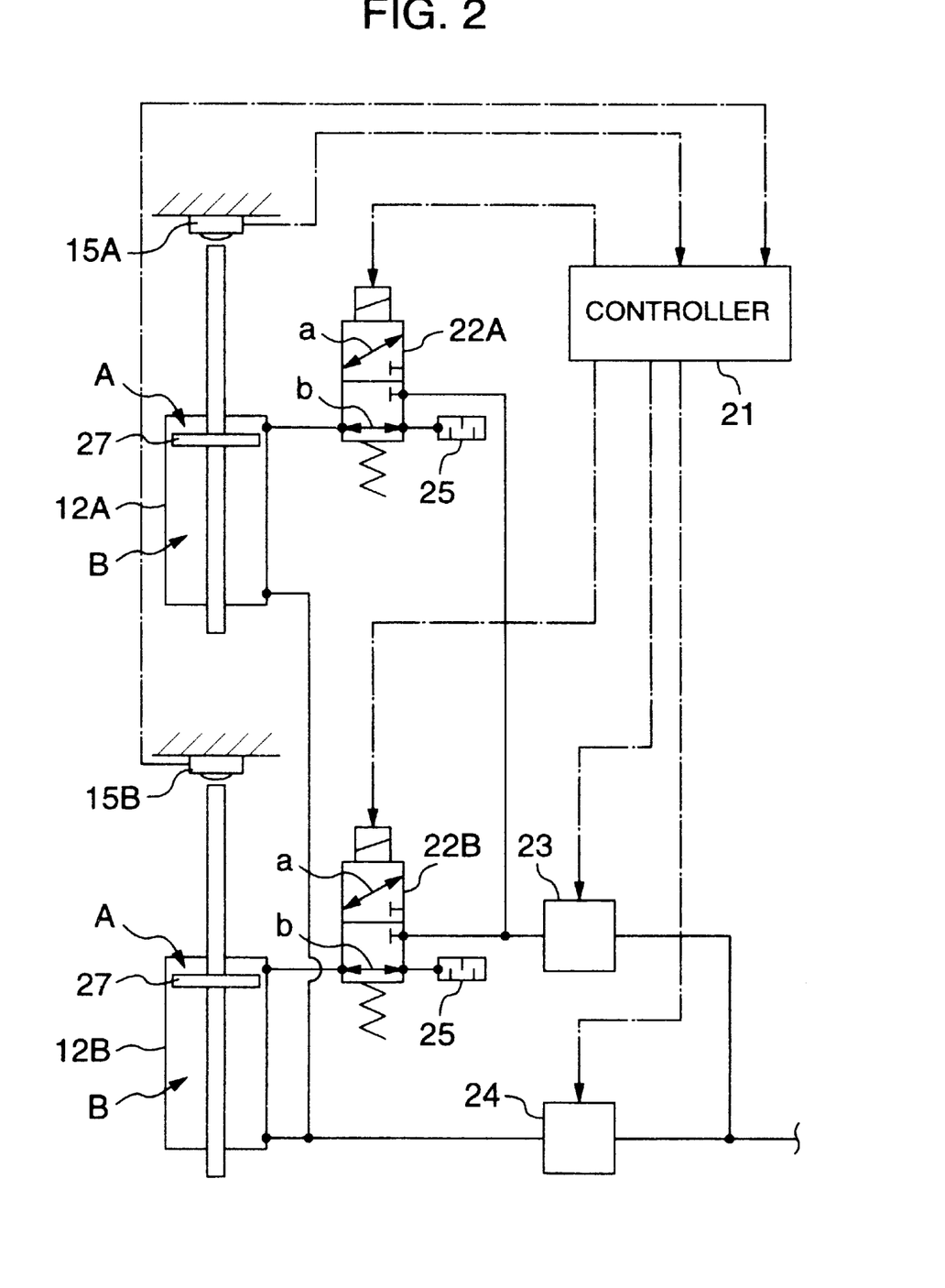
FIGS. 2 to 4 are a block diagram of a pressing force control system in the apparatus.
Figure 3:
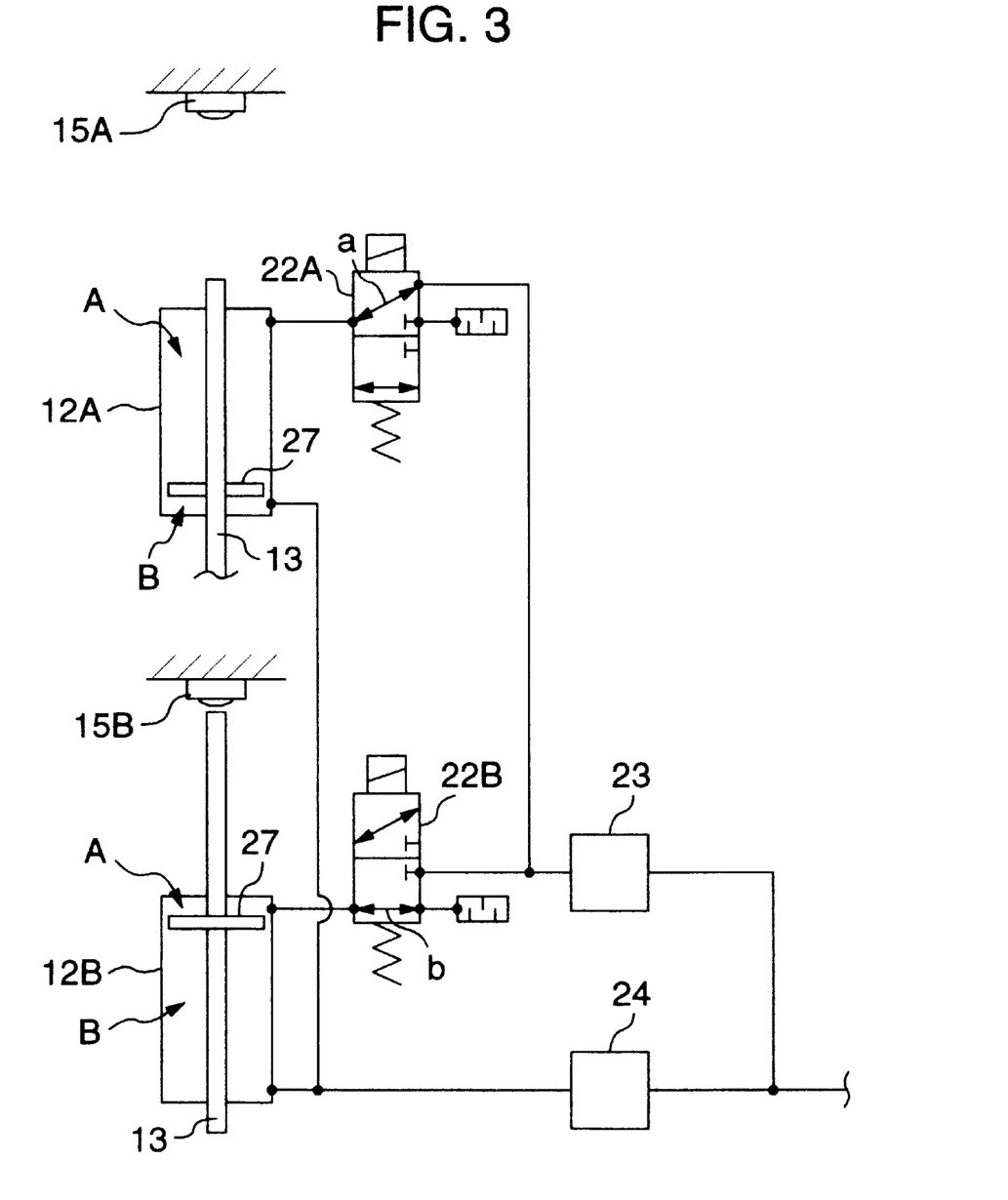
Figure 4:
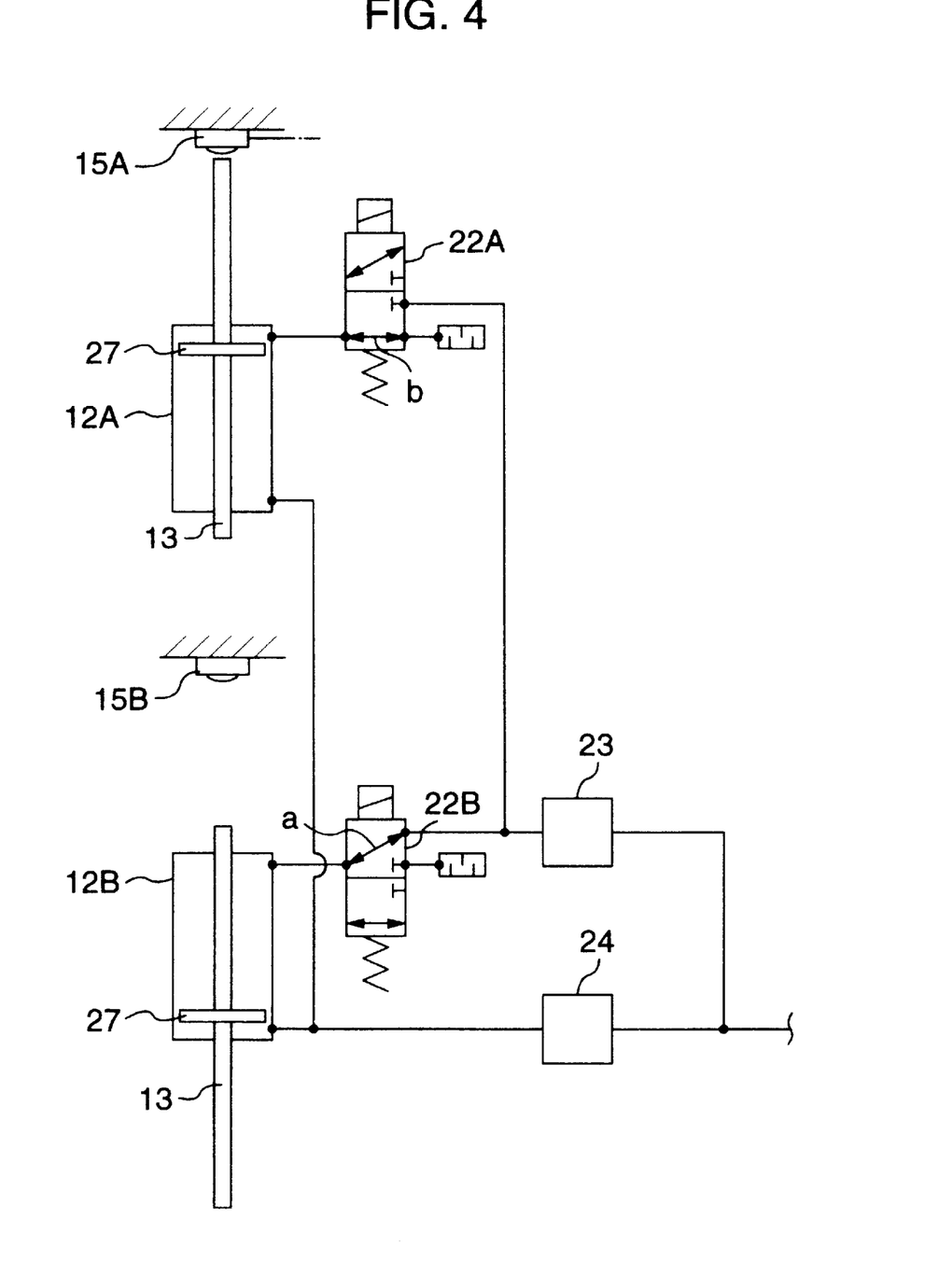
Figure 5:
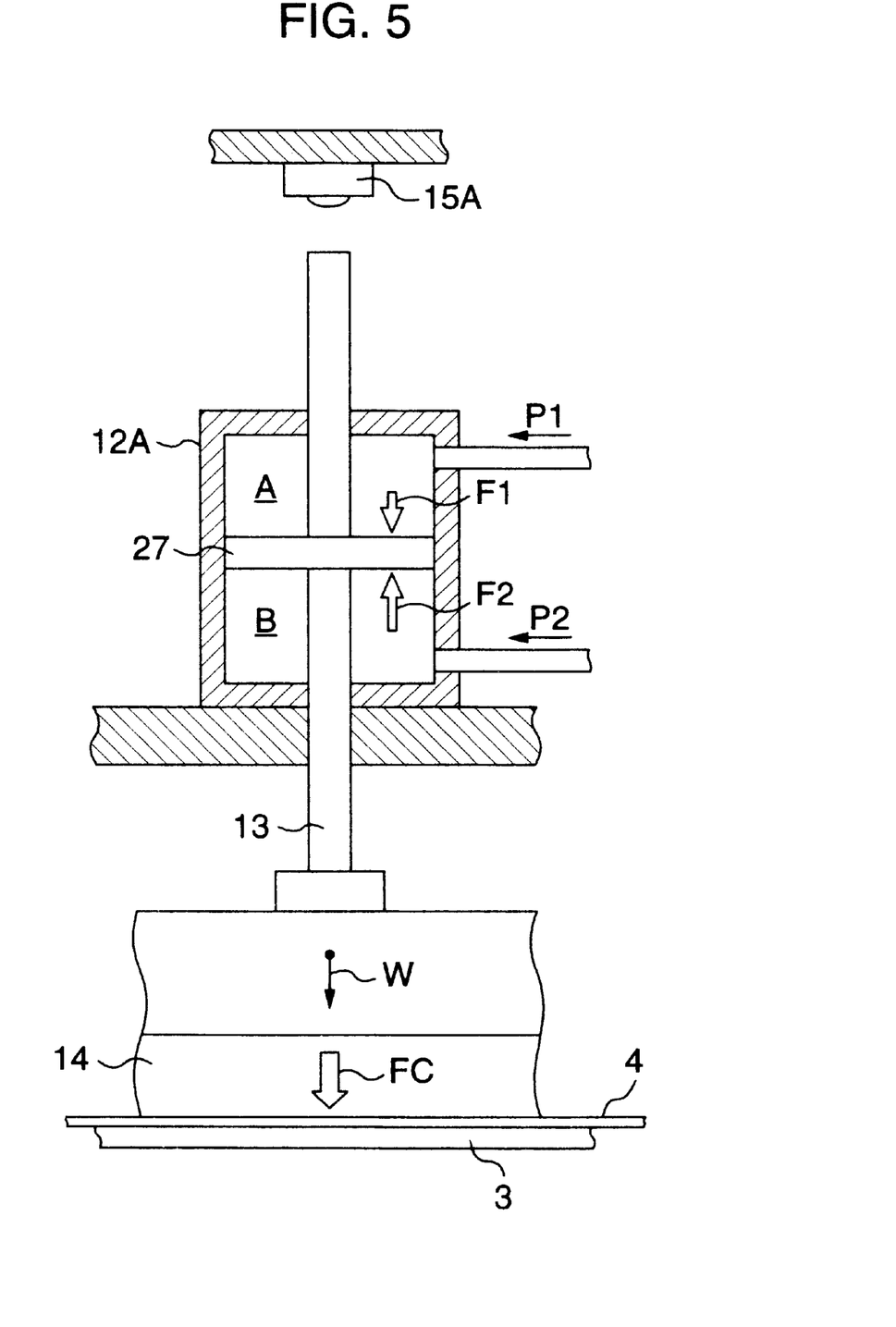
FIGS. 5 and 6 are a cross-sectional view of a cylinder in the apparatus.
Figure 6:
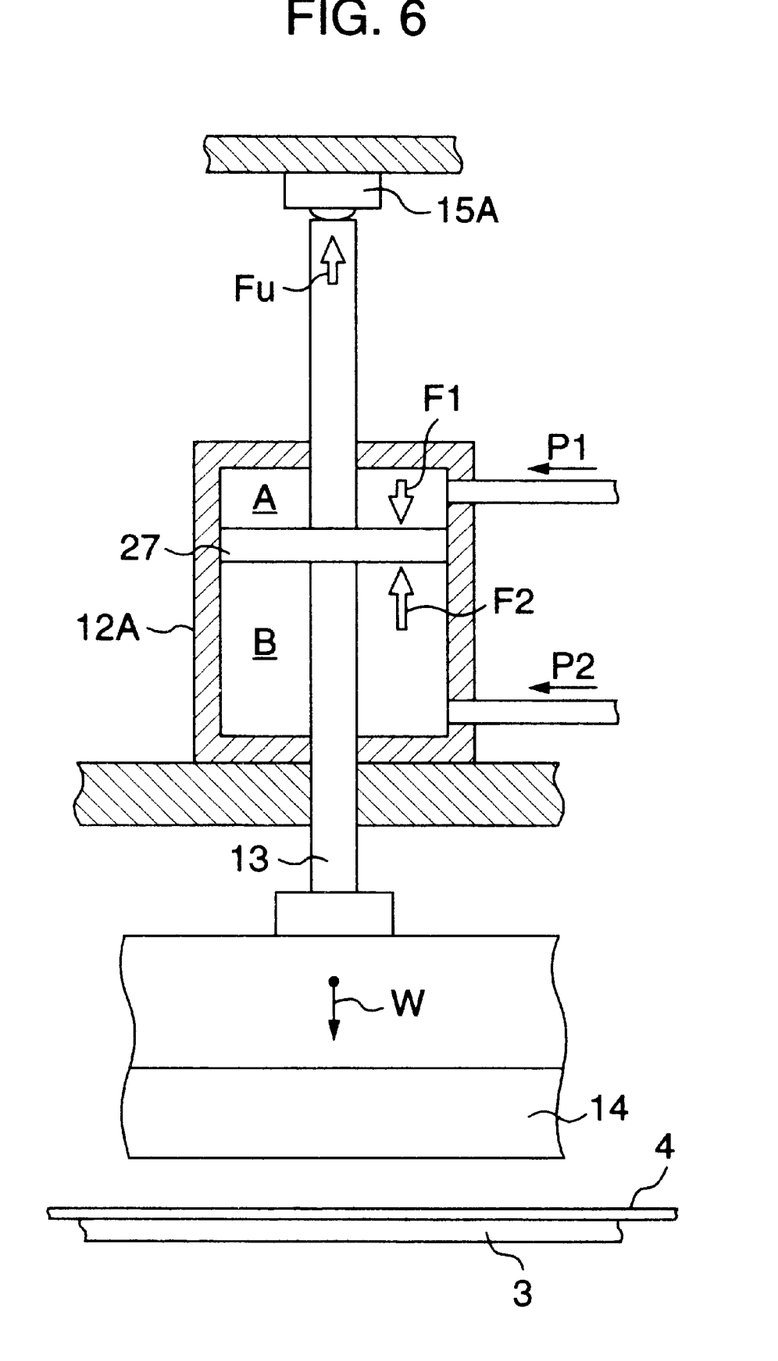
Figure 7:
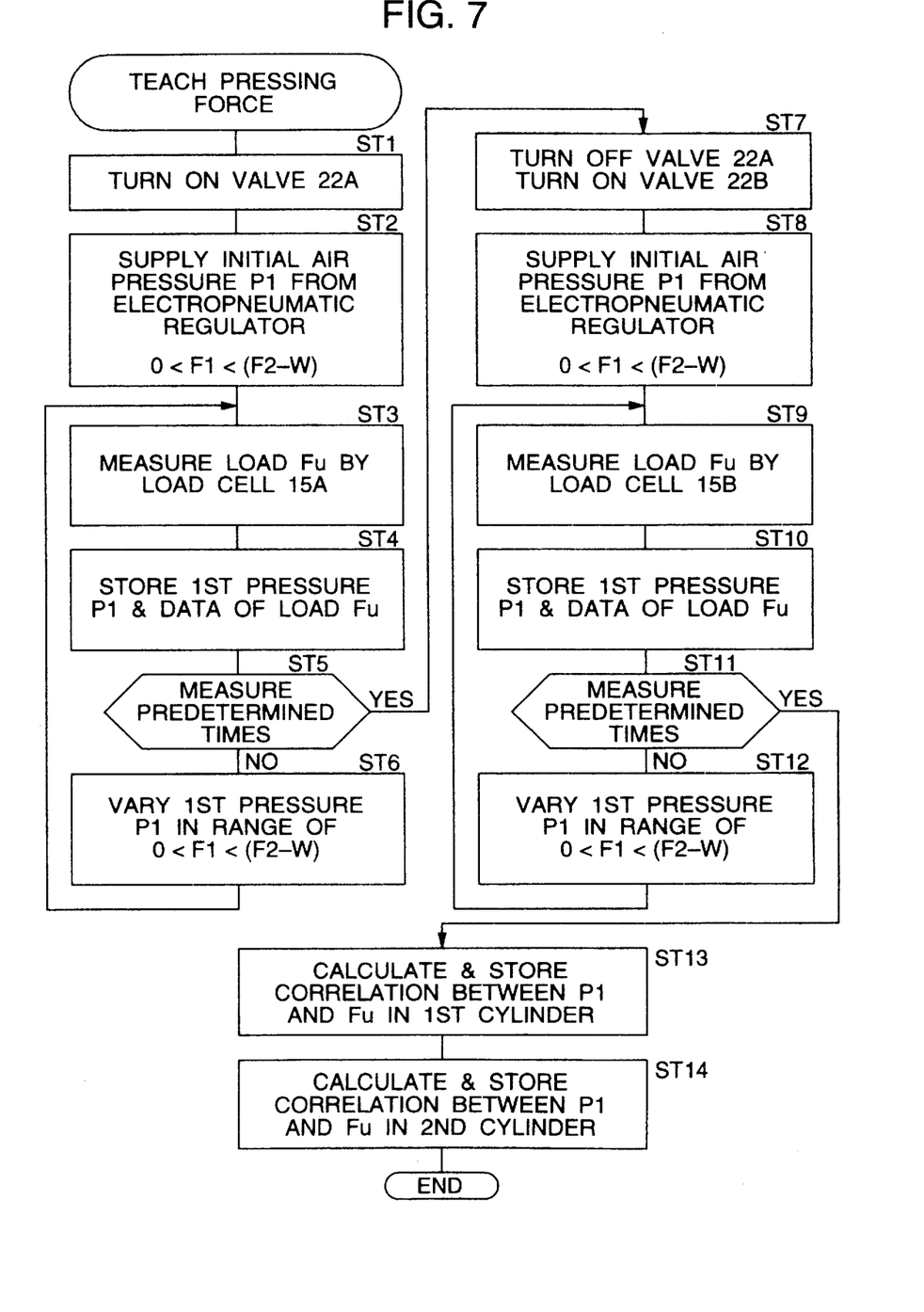
FIG. 7 is a flow chart of the operation of the apparatus.
Figure 8:
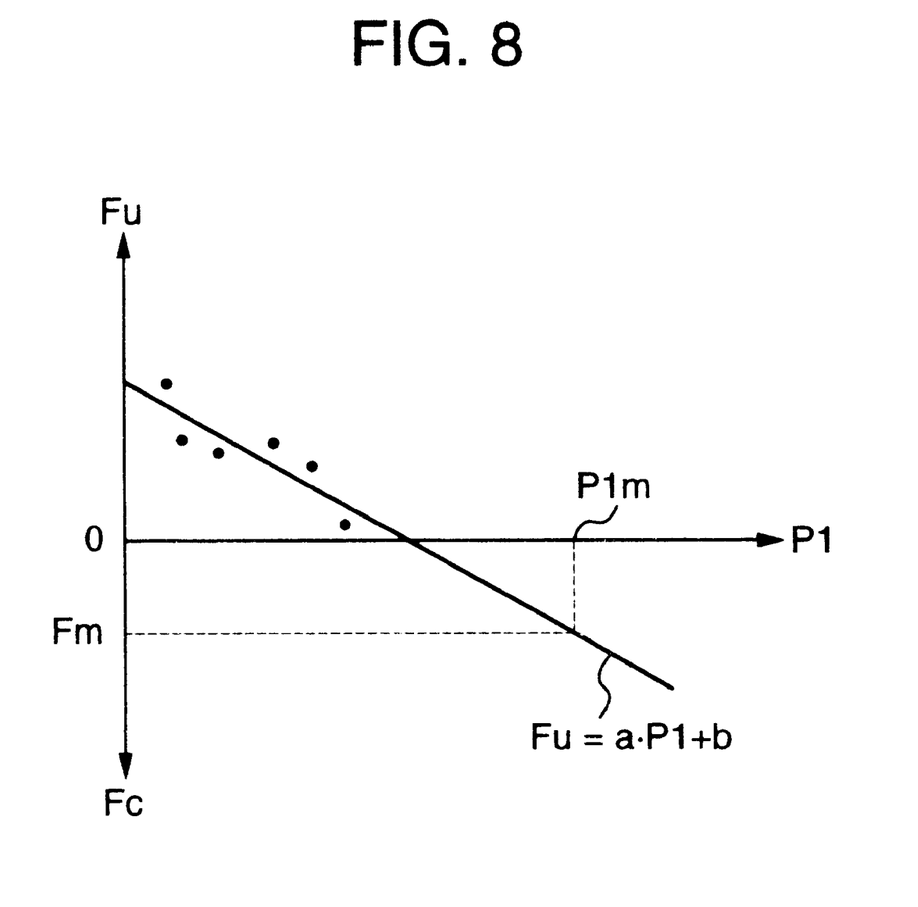
FIG. 8 is a diagram showing the correlation between an instruction pressure and the pressing force in the apparatus.

A preferred embodiment of the present invention will now be described with reference to the drawings. FIG. 1 is a side-elevational view of one preferred embodiment of a solder paste screen printing apparatus of the present invention, FIGS. 2, 3 and 4 are a block diagram of a pressing force control system in the apparatus, FIGS. 5 and 6 are a cross-sectional view of a cylinder in the apparatus, FIG. 7 is a flow chart of the operation of the apparatus, and FIG. 8 is a diagram showing the correlation between an instruction pressure and the pressing force in the apparatus.

First, the overall construction of the solder paste screen printing apparatus will be described with reference to FIG. 1. A substrate holder 2 is mounted on a moving table 1. A substrate 3 is placed on the substrate holder 2. When the moving table 1 is driven, the substrate 3 is moved in a horizontal direction, so that its position is adjusted. Namely, the moving table 1 is a positioning portion for locating the substrate 3 in a predetermined position.

A screen mask 4 is superposed on the substrate 3. Pattern holes, corresponding to electrodes on an upper surface of the substrate 3, are formed through the screen mask 4. A squeegee unit 10 comprises two (right and left) cylinders (that is, a first cylinder 12A and a second cylinder 12B) mounted on a squeegee holder 11. The first and second cylinders 12A and 12B are operated by the pressure of a fluid such as air. A squeegee 14 is connected to a rod 13 of each of the cylinders 12A and 12B. When the rod 13 of each cylinder 12A, 12B is extended and retracted, the associated squeegee 14 is moved downward and upward. In FIG. 1, the left squeegee 14 is held in its lower position where it is held in contact with the screen mask 4, whereas the right squeegee 14 is held in its upper, retracted position.

In this condition, when the squeegee 14 is slid in a right-hand direction, solder paste 5 is coated onto the electrodes on the substrate 3 through the screen mask 4, and then the substrate 3 is separated from the screen mask 4, and the solder paste 5 is printed on the electrodes on the substrate 3. The left and right squeegees 14 are alternately brought into contact with the screen mask 4, and are slid over the screen mask alternately in opposite directions, thereby effecting the printing of the solder paste 5.

Two (left and right) load cells (load sensors) 15A and 15B are mounted on a lower surface of an upper wall of the squeegee holder 11, and measure the pressing forces of the left and right squeegee 14, respectively. This measuring method will be described later.

The squeegee holder 11 is connected to a bracket 16. A nut 17 is mounted in an upper end portion of the bracket 16, and the nut 17 is threaded on a horizontal feed screw 18. Therefore, when the feed screw 18 is rotated by a motor 19, the nut 17 moves along the feed screw 18, so that the squeegee 14, held in contact with the screen mask 4, slides over this screen mask 4. Reference numeral 20 denotes a support frame for the feed screw 18.

Next, a pressing force control mechanism for imparting the pressing force to the left and right squeegees 14 will be described with reference to FIG. 2. A common control system is used for the first and second cylinders 12A and 12B. Load data from the load cells 15A and 15B are inputted into the controller 21. The cylinders 12A and 12B are controlled by the controller 21 respectively via change-over valves 22A and 22B. Each of the change-over valves 22A and 22B has a first passage a and a second passage b. The interior of each of the cylinders 12A and 12B is divided by a piston 27 into an upper chamber A and a lower chamber B, and the change-over valves 22A and 22B communicate respectively with the upper chambers A of the cylinders 12A and 12B.

A first pressure control portion 23 and a second pressure control portion 24 are connected to the controller 21, and in accordance with a pressure instruction from the controller 21, the first and second pressure control portions 23 and 24 apply instruction pressures to the cylinders 22A and 22B. The first pressure control portion 23 is an electropneumatic regulator, and is connected to the second passages b of the change-over valves 22A and 22B. The pressure control portion 24 is a pressure control regulator, and communicates with the lower chambers B of the cylinders 12A and 12B. The second pressure control portion 24 normally applies, to the lower chambers B, a pressure sufficiently large to force a vertically (upwardly-downwardly) moving portion (which includes the rod 13, the squeegee 14 and the piston 27, and is moved upward and downward together with the squeegee 14) upward.

The first pressure control portion 23 and the second pressure control portion 24 are connected to a pressure source (not shown) via pipes. Reference numeral 25 denotes a silencer for eliminating the sound produced when the air is exhausted.

FIG. 3 shows a condition in which the air is fed to the upper chamber A of the first cylinder 12A to force the piston 27 downward to lower the rod 13 while the air is fed to the lower chamber B of the second cylinder 12B, with the air exhausted from the upper chamber A of the second cylinder 12B, to thereby force the piston 27 upward to raise the rod 13. At this time, the first passage a is connected to the upper chamber A of the first cylinder 12A, and the pressure is fed to this upper chamber A from the first pressure control portion 23. The first pressure control portion 23 feeds, to the upper chamber A of the first cylinder 12A, a pressure sufficiently large to force the piston 27 downward against the pressure in the lower chamber B to thereby lower the squeegee 14. When the upper chamber A of the second cylinder 12B is connected to the passage b of the change-over valve 22B, so that the air in the upper chamber A is exhausted to the exterior via the silencer 25, the piston 27 and hence the squeegee 14 are moved upward by the pressure in the lower chamber B. FIG. 4 shows a condition reverse to the condition of FIG. 3, that is, a condition in which the change-over valves 22A and 22B are switched, and the rod 13 of the first cylinder 12A is raised while the rod 13 of the second cylinder 12B is lowered.

FIG. 5 shows a condition in which the rod 13 of the first cylinder 12A is lowered to hold the squeegee 14 in contact with the screen mask 4. FIG. 6 shows a condition in which the pressure, fed to the upper chamber A, is decreased so as to raise the rod 13 to thereby lift or float the squeegee 14 away from the screen mask 4. In this condition, the upper end of the rod 13 is pressed against the load cell 15A, and its load is measured. The rod 13 is disposed at the centers of the squeegee 14 and piston 27, and substantially coincides with the center of gravity of the vertically-moving portion movable with the squeegee 14. Therefore, by pressing the rod 13 against the load cell 15A, the load can be measured accurately. Since the load cell 15A is provided above the squeegee 14, the load cell 15A will not prevent the downward movement of the squeegee 14, and therefore there is achieved an advantage that the squeegee unit can be simplified in construction. The second cylinder 12B operates in the same manner as described above for the first cylinder 12A in FIGS. 5 and 6. In this embodiment, the first cylinder 12A, the second cylinder 12B, the change-over valves 22A and 22B, the first pressure control portion 23, the second pressure control portion 24, the controller 21 and so on jointly constitute the pressing force control mechanism.

The principle of a pressing force-adjusting method will now be described. The pressing force-adjusting methods for the two squeegees are the same, and therefore the pressing force-adjusting method for the squeegee 14, connected to the first cylinder 12A, will be described below.

As shown in FIG. 6, a first pressure P1 is applied to the upper chamber A of the first cylinder 12A, and a second pressure P2 is applied to the lower chamber B of this cylinder. The relation between a downward force F1, produced by the first pressure P1, an upward force F2, produced by the second pressure P2, and the weight W of the vertically-moving portion movable upward and downward with the squeegee 14, is expressed by a formula, 0<F1<(F2−W). In this embodiment, the second pressure P2 is kept constant. The load Fu, applied to the load cell 15A, is repeatedly measured while gradually increasing the first pressure P1 within the range to satisfy the above formula.

FIG. 8 is a graph showing the correlation between the first pressure P1 and the load Fu thus measured. The relation between the load Fu and the first pressure P1 is expressed by a linear formula, Fu=a·P1+b. Therefore, by calculating the factors a and b by the measured values of the load Fu and the data of the first pressure P1, this linear formula can be found. In the formula (Fu=a·P1+b) shown in FIG. 8, when the first pressure P1 exceeds a certain value, the value of the load Fu becomes minus, and this means that the force F1, produced by the first pressure P1, is larger than (F2−W), so that the squeegee 14 moves downward. Namely, the range of Fu<0 indicates the force Fc of pressing of the squeegee 14 against the screen mask 4. Therefore, the load Fu, measured by the load cell 15A can be regarded as being equal to the pressing force (Only the direction is opposite with respect to the upward and downward forces), and the accurate correlation between the first pressure P1 and the pressing force Fc can be found using this load cell 15A. Then, if this correlation is found, the value of the first pressure P1m necessary for obtaining the target pressing force Fm can be easily calculated. The value of this target pressing force Fm is predetermined by tests or the like.

This solder paste screen printing apparatus has the above construction, and a method of using this apparatus, as well as its operation, will now be described. Before the solder paste 5 is printed onto the substrate 3 by this solder paste screen printing apparatus, the pressing force of each of the squeegees 14 is adjusted. FIG. 7 is a flow chart showing a pressing force-teaching operation, and the correlation between the pressing force Fu and the first pressure P1 is found by this press force-teaching operation. This pressing force-teaching operation is first effected for the first cylinder 12A. First, the valve 22A is turned on to connect the first pressure control portion 23 to the upper chamber A of the first cylinder 12A (ST1). At this time, the valve 22B is held in the OFF state. Then, the first pressure P1 is supplied to the upper chamber A from the first pressure control portion 23 (ST2). The first pressure P1 at this time, has a value satisfying the formula, 0<F1<(F2−W). Then, the load Fu, applied to the load cell 15A from the rod 13, is measured (ST3), and the thus measured load Fu and data of the first pressure P1 at this time are stored in a memory portion in the controller 21 (ST4). It is judged whether or not this measurement has been effected a predetermined number of times (ST5), and if this judgment result is "NO", the first pressure P1 is varied in the range to satisfy the formula, 0<F1<(F2−W) (ST6), and the processing from ST3 to ST6 is repeated until the measurement is effected the predetermined number of times.

Then, when the measurement is effected the predetermined number of times, the valve 22A is turned off, and the valve 22B is turned on to connect the first pressure control portion 23 to the upper chamber A of the second cylinder 12B (ST7). Then, with respect to the second cylinder 12B, the load Fu is measured (ST8 to ST12) as in ST2 to ST6. Then, when the measurement for the second cylinder 12B is completed, the correlation between the first pressure P1 and the load Fu (and hence the pressing force Fc) with respect to the first cylinder 12A is found (ST13). In this embodiment, the factors a and b of the formula, Fc=a·P1+b, are calculated by a method of least squares or the like. Similarly, the correlation with respect to the second cylinder 12B is calculated (ST14).

As described above, if the correlation between the first pressure P1 and the pressing force Fc is found as described above, the first pressure P1m necessary for obtaining the target pressing force Fm can be determined. The value of the target pressing force Fm is predetermined by tests or the like, and is beforehand stored in the memory portion of the controller 21. The controller 21 calculates the first pressure P1m necessary for obtaining the target pressing force Fm with respect to each of the first and second cylinders 12A and 12B.

When the value of the first pressure P1m necessary for obtaining the target pressing force Fm is determined in the above manner, the printing of the solder cream 5 onto the substrate 3 is started in accordance with this determination.

In the above embodiment, although the data, shown in FIG. 8, is obtained by varying the first pressure P1 while keeping the second pressure P2 constant, there may be used a reverse method in which the second pressure P2 is varied in accordance with the pressure instruction from the controller 21 while keeping the first pressure P1 constant. Thus, it is only necessary to vary the first pressure P1 or the second pressure P2 while satisfying the above formula. Therefore, it is not always necessary to keep the second pressure P2 constant, but by doing so, the control can be effected more easily.

Although the correlation between the pressing force Fu and the first pressure P1 is expressed by the linear formula, this expression is not limited to it, but any other suitable formula can be used in so far as it can determine the value of the first pressure P1 from the necessary pressing force Fu. In this embodiment, although the air pressure is utilized, a liquid such as oil can be used in the present invention. Furthermore, instead of the pressing force Fu, a printing pressure Fp may be used. This printing force Fp is obtained by dividing the pressing force Fu by the length L of the squeegee 14, and the relation, Fu=Fp·L, is established. Therefore, data of the target value of the printing pressure Fp and data of the length L of the squeegee 14 are stored in the controller 21 so that the pressing force Fu can be obtained.

In the present invention, the optimum squeegee-pressing force necessary for screen printing the solder paste onto the substrate can be accurately determined, and the invention is particularly effective for screen printing the solder paste onto the electrodes of a fine pitch, which requires the pressing force smaller than the weight of the squeegee. And besides, the pressing force is determined based on the objective data, and therefore the differences (or variations) between the individual operators are eliminated. Furthermore, the characteristics of the cylinders is liable to vary because of variations in sliding frictional force between the piston and the inner surface of the cylinder, but in the present invention, the pressing force is determined suitably so as to correct the data, and by doing so, the optimum pressing force can be set in accordance with the variations in the characteristics of the cylinders.

What is claim is:

1. A solder paste screen printing apparatus comprising:
   a positioning table for positioning a workpiece;
   a screen mask located above said workpiece positioned on said positioning table;
   a squeegee for sliding over said screen mask to coat solder paste onto said workpiece through pattern holes formed through said screen mask; and
   a pressing force control mechanism for controlling a squeegee-pressing force of said squeegee against said screen mask;
   said pressing force control mechanism comprising:
   a cylinder including a vertical rod having a lower end to which said squeegee is connected;
   a first pressure control portion for feeding a fluid to an upper chamber of said cylinder so as to impart a downward force to said rod of said cylinder;
   a second pressure control portion for feeding the fluid to a lower chamber of said cylinder so as to impart an upward force to said rod of said cylinder;
   a controller for feeding pressure instructions respectively to said first and/or second pressure control portions so as to control the force of pressing of said squeegee against said screen mask by the pressure difference between the fluid in said upper chamber and the fluid in said lower chamber; and
   a load sensor disposed above said squeegee for detecting said squeegee-pressing force.

2. A solder paste screen printing method wherein a rod of a cylinder is vertically moved by a pressure difference between a fluid in an upper chamber of said cylinder and the fluid in a lower chamber of said cylinder so as to bring a squeegee, connected to a lower end of said rod, into contact with a screen mask, and in this condition said squeegee is slid over said screen mask to coat solder paste onto a workpiece through pattern holes formed through said screen mask, said method comprising the steps of:
   applying an instruction pressure to said cylinder a plurality of times in accordance with a pressure instruction from a controller, and detecting a squeegee-pressing force by a load sensor each time the instruction pressure is applied to said cylinder;
   finding the correlation between the instruction pressure and the pressing force from the instruction pressure and the pressing force detected by said load sensor;
   finding the instruction pressure, necessary for obtaining an optimum squeegee-pressing force, from said correlation; and
   applying the fluid pressure, determined by said instruction pressure, to said cylinder, thereby effecting printing of the solder paste onto said workpiece.

3. A method according to claim 2, in which said correlation is detected by each of a plurality of said load sensors corresponding respectively to a plurality of said cylinders, and is found for each of said cylinders.

4. A solder paste screen printing apparatus comprising:
   a positioning table for positioning a work-piece;

a screen mask located above said workpiece positioned on said positioning table;

a squeegee for sliding over said screen mask to coat solder paste onto said workpiece through pattern holes formed through said screen mask; and a pressing force control mechanism for controlling a force of pressing of said squeegee against said screen mask;

said pressing force control mechanism comprising:

a cylinder including a vertical rod having a lower end to which said squeegee is connected;

a first pressure control portion for applying a fluid pressure to an upper chamber of said cylinder so as to impart a downward force to said squeegee connected to said rod of said cylinder;

a second pressure control portion for applying to a lower chamber of said cylinder a fluid pressure sufficiently large to force said squeegee upward; and a controller for controlling the fluid pressure to be applied from said first pressure control portion so as to control the force of pressing of said squeegee against said screen mask.

5. Apparatus according to claim 4, further comprising:

a load sensor for detecting an upward pressing force of said squeegee when the fluid pressure, applied from said first pressure control portion, is reduced to move said squeegee upward; and calculation means for calculating the pressure from said first pressure control portion, which pressure is necessary for pressing said squeegee against said screen mask with a target pressing force, in accordance with results of the detection by said load sensor.

6. A solder paste screen printing method comprising the steps of:

providing an apparatus comprising (a) a positioning table for positioning a workplace, (b) a screen mask located above said workpiece positioned on said positioning table, (c) a squeegee for sliding over said screen mask to coat solder paste onto said workpiece through pattern holes formed through said screen mask, and (d) a pressing force control mechanism for controlling a force pressing of said squeegee against said screen mask, said pressing force control mechanism comprising (i) a cylinder including a vertical rod having a lower end to which said squeegee is connected, (ii) a first pressure control portion for applying a fluid pressure to an upper chamber of said cylinder so as to impart a downward force to said squeegee connected to said rod of said cylinder, (iii) a second pressure control portion for applying to a lower chamber of said cylinder a fluid pressure sufficiently large to force said squeegee upward, and (iv) a controller for controlling the fluid pressure to be applied from said first pressure control portion so as to control a squeegee-pressing force against said screen mask;

detecting an upward pressing force of said squeegee when the fluid pressure, applied from said first pressure control portion, is reduced to move said squeegee upward;

finding the correlation between the fluid pressure, applied from said first pressure control portion, and said squeegee-pressing force by said detected upward pressing force;

calculating the fluid pressure, necessary for pressing said squeegee against said screen mask with a target pressing force, from said correlation; and applying the pressure, calculated by said first pressure control portion, to said upper chamber to move said squeegee downward into contact with said screen mask, and moving said squeegee so as to effect the printing of the solder paste.

* * * * *